(12) United States Patent
Ohmori et al.

(10) Patent No.: US 8,441,082 B2
(45) Date of Patent: May 14, 2013

(54) MEMORY ELEMENT AND MEMORY

(75) Inventors: Hiroyuki Ohmori, Kanagawa (JP); Masanori Hosomi, Tokyo (JP); Kazuhiro Bessho, Kanagawa (JP); Yutaka Higo, Kanagawa (JP); Kazutaka Yamane, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/225,775

(22) Filed: Sep. 6, 2011

(65) Prior Publication Data

US 2012/0061781 A1 Mar. 15, 2012

(30) Foreign Application Priority Data

Sep. 13, 2010 (JP) .................. 2010-204835

(51) Int. Cl.
*H01L 29/82* (2006.01)

(52) U.S. Cl.
USPC .................. 257/421; 257/E29.323

(58) Field of Classification Search .................. 257/421, 257/E29.323
See application file for complete search history.

(56) References Cited

U.S. PATENT DOCUMENTS

| | | | |
|---|---|---|---|
| 6,956,766 B2 | 10/2005 | Nakamura | |
| 2009/0080124 A1* | 3/2009 | Yoshikawa et al. | 360/324.12 |
| 2009/0290255 A1* | 11/2009 | Sakawaki | 360/110 |
| 2010/0097847 A1 | 4/2010 | Ohmori | |

FOREIGN PATENT DOCUMENTS

| | | |
|---|---|---|
| JP | 2004-193595 | 7/2004 |
| JP | 2009-81215 | 4/2009 |
| JP | 2010-98245 | 4/2010 |

* cited by examiner

*Primary Examiner* — Calvin Lee
*Assistant Examiner* — Monica D Harrison
(74) *Attorney, Agent, or Firm* — K&L Gates LLP

(57) ABSTRACT

There is provided a memory element including a magnetic layer that includes $Fe_xNi_yB_z$ (here, $x+y+z=1$, $0.2x \leq y \leq 4x$, and $0.1(x+y) \leq z \leq 0.4(x+y)$) as a main component, and has magnetic anisotropy in a direction perpendicular to a film face; and an oxide layer that is formed of an oxide having a sodium chloride structure or a spinel structure and comes into contact with one face of the magnetic layer.

8 Claims, 3 Drawing Sheets

MEMORY ELEMENT AND MEMORY

CROSS REFERENCES TO RELATED APPLICATIONS

The present application claims priority to Japanese Priority Patent Application JP 2010-204835 filed in the Japan Patent Office on Sep. 13, 2010, the entire contents of which are hereby incorporated by reference.

BACKGROUND

The present application relates to a memory element that includes a magnetic layer having magnetic anisotropy perpendicular to a film face, and a memory having the memory element.

In an information device such as a computer, a highly dense DRAM that operates at a high speed has been widely used as a random access memory. However, the DRAM is a volatile memory in which information is erased when power is turned off, such that a non-volatile memory in which the information is not erased is desirable. As a candidate for the non-volatile memory, a magnetic random access memory (MRAM) in which the information is recorded by magnetization of a magnetic material has attracted attention and therefore has been developed.

As a method of performing a recording of an MRAM, a method of inverting magnetization using a current magnetic field, or a method of causing a magnetization inversion by directly injecting an electron that is spin-polarized into a recording layer (for example, refer to Japanese Unexamined Patent Application Publication No. 2004-193595) may be exemplified. Among these, spin injection magnetization inversion, which can make a write current small as a memory element size decreases, has attracted attention. In addition, a method of using a perpendicular magnetization film in which a magnetization direction of a magnetic material faces a perpendicular direction, for the miniaturization of a memory element, has been studied (for example, refer to Japanese Unexamined Patent Application Publication No. 2009-81215). In addition, a method of performing highly dense recording using migration of a magnetic domain wall has been devised (refer to Japanese Unexamined Patent Application Publication No. 2010-98245).

SUMMARY

In a perpendicular magnetization film used in such a magnetic memory, it is necessary to decrease a magnetic braking constant for allowing a spin torque to work effectively. However, an existing perpendicular magnetization film, such as TbFeCo or CoPt has a large magnetic braking constant, and thus is not suitable for such a magnetic memory using spin torque. In addition, there is a problem in that a magnetoresistance change when forming a magnetic tunnel junction is small.

It is desirable to provide a memory element that has a small magnetic braking constant and that is capable of decreasing a driving current.

According to an embodiment, there is provided a memory element including a magnetic layer that includes $Fe_xNi_yB_z$ (here, $x+y+z=1$, $0.2x \leq y \leq 4x$, and $0.1(x+y) \leq z \leq 0.4(x+y)$) as a main component, and has magnetic anisotropy in a direction perpendicular to a film face. In addition, the memory element includes an oxide layer that is formed of an oxide having a sodium chloride structure or a spinel structure and comes into contact with one face of the magnetic layer.

In addition, according to another embodiment, there is provided a memory including the memory element and an interconnect that supplies a current to the memory element.

According to the memory element and the memory according to embodiments, it is possible to form a magnetic layer that has stable perpendicular magnetization in which a magnetic braking constant is small by forming a magnetic layer having the above-described composition on an oxide layer having a sodium chloride structure or a spinel structure. Therefore, it is possible to realize a memory element that can operate at a high speed with a low current.

According to the embodiments, it is possible to provide a memory element that has a small magnetic braking constant and that is capable of decreasing a driving current.

Additional features and advantages are described herein, and will be apparent from the following Detailed Description and the figures.

DETAILED DESCRIPTION

Embodiments of the present application will be described below in detail with reference to the drawings.

Figure 1:
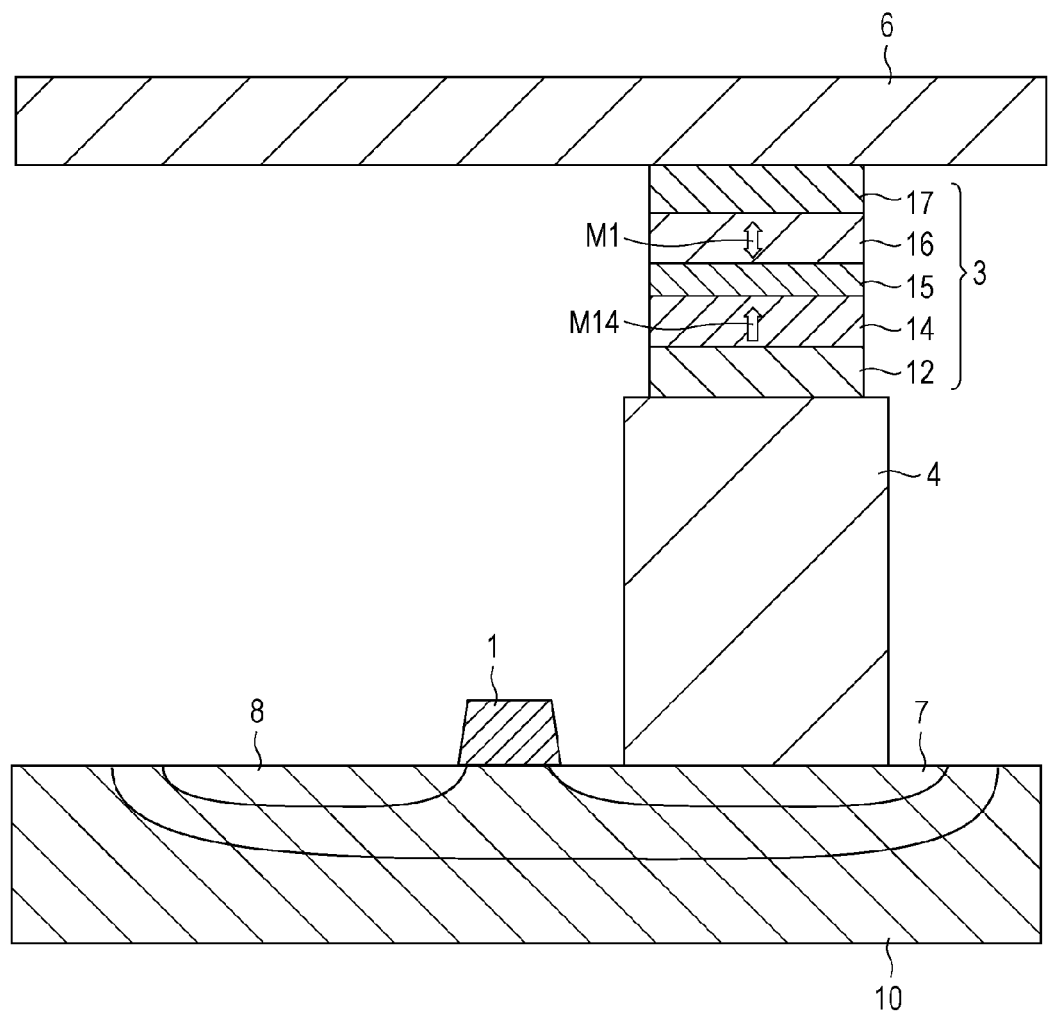
FIG. 1 is a schematic configuration view of a memory according to an embodiment.

In addition, description will be made in the following order.
1. Embodiment of Memory Element of Present Disclosure
2. Experiment Example of Memory Element of Embodiment 1. Embodiment of Memory Element of Present Disclosure Configuration Example of Memory A schematic configuration diagram (cross-sectional view) of a memory according to an embodiment is shown in FIG. 1.

This memory includes a memory element, which can retain information using a magnetization state, disposed in the vicinity of an intersection between two kinds of address interconnects (for example, a word line and a bit line) that are orthogonal to each other.

Specifically, a drain region 8, a source region 7, and a gate electrode 1, which make up a selection transistor that selects each memory cell, are formed at portions separated by an element separation layer of a semiconductor substrate 10 such as a silicon substrate, respectively. Among these, the gate electrode 1 also functions as an address interconnect (for example, a word line) that extends in the front-back direction in the drawing.

The drain region 8 is formed commonly to a plurality of selection transistors formed on the substrate, and an interconnect is connected to the drain region 8.

A memory element 3 is disposed between the source region 7 and the address interconnect (for example, a bit line) 6 that is disposed over the source region 7. The memory element 3 includes a memory layer that is formed of a magnetic layer whose magnetization direction is inverted by spin injection.

In addition, the memory element 3 is disposed in the vicinity of an intersection between one side address interconnect (gate electrode) 1, and the other side address interconnect 6.

The memory element 3 is connected to the bit line (address interconnect) 6, and is connected to the source region 7 through a contact layer 4.

In this manner, it is possible to supply a current to the memory element 3 through two kinds of address interconnects 1 and 6. In addition, it is possible to invert a magnetization direction of the memory layer through spin injection by flowing a current to the memory element 3 in a vertical direction thereof (a lamination direction of the memory element 3).

Configuration Example of Memory Element

Next, the memory element 3 of this embodiment will be described.

As shown in FIG. 1, the memory element 3 has a lamination structure in which an underlying layer 12, a magnetization-fixed layer (reference layer) 14, an oxide layer 15, a magnetic layer 16, and a boron adsorbing layer 17 are sequentially laminated on the contact layer 4. In addition, an upper electrode (not shown) is provided on the boron adsorbing layer 17 and a lower electrode (not shown) is provided at the bottom of the underlying layer 12. In addition, an interconnect that is connected to the bit line is provided to the upper electrode, such that the memory element 3 is configured.

The memory element 3 performs a storage of information using a direction of magnetization M1 of the magnetic layer 16 having uniaxial anisotropy. In addition, a current is applied in a direction perpendicular to a film face and thus spin torque magnetization inversion is generated and thereby performs writing.

The magnetization-fixed layer 14 is provided at a lower layer of the magnetic layer 16 in which the direction of the magnetization M1 is inverted by spin injection. The oxide layer 15 is provided between the magnetic layer 16 and the magnetization-fixed layer 14, and the magnetic layer 16 and the magnetization-fixed layer 14 make up an MTJ element.

Memory Element: Magnetization-Fixed Layer

The magnetization-fixed layer 14 may be configured by only a ferromagnetic layer or may be configured in such a manner that the magnetization direction is fixed by using an anti-ferromagnetic combination of an anti-ferromagnetic layer and a ferromagnetic layer. In addition, the magnetization-fixed layer 14 may be configured by a single layer of a ferromagnetic layer, or a ferri-pin structure in which a plurality of ferromagnetic layers is laminated through a non-magnetic layer.

When the magnetization-fixed layer 14 is configured by the laminated ferri-pin structure, it is possible to decrease sensitivity of the magnetization-fixed layer with respect to an external magnetic field, such that unnecessary magnetization fluctuation in the magnetization-fixed layer with respect to the external magnetic field is suppressed, and thereby it is possible to stably operate the memory element. In addition, it is possible to adjust a thickness of each ferromagnetic layer, such that it is possible to suppress a leakage magnetic field from the magnetization-fixed layer.

It is necessary for the magnetization-fixed layer 14 to have a magnetization inversion current larger than in the magnetic layer 16, such that it is necessary to make a thickness of the magnetization-fixed layer 14 larger than that of the magnetic layer 16. An inversion current difference between the magnetization-fixed layer 14 and the magnetic layer 16 is sufficiently secured. For example, the thickness may be 1 to 40 nm.

As a material of the ferromagnetic layer for the magnetization-fixed layer 14, an alloy including Co as a main component, and at least one element selected from a group consisting of Cr, Ta, Nb, V, W, Hf, Ti, Zr, Pt, Pd, Fe, and Ni. For example, CoCr, CoPt, CoCrTa, CoCrPt, or the like may be used. In addition, an amorphous alloy of Tb, Dy, Gd, and a transition metal may be used. For example, TbFe, TbCo, TbFeCo, or the like may be used. As a non-magnetic material making up the laminated ferri-pin structure, Ru, Re, Ir, Os, an alloy thereof, or the like may be used.

Memory Element: Oxide Layer

The oxide layer 15 is formed of an oxide having a sodium fluoride (NaCl) structure or a spinel structure.

As an oxide having the sodium fluoride structure, for example, MgO, CoO, NiO, TiO, or the like may be used. Particularly, in a case where MgO is used, it is possible to realize stable perpendicular magnetic anisotropy, and when being used as a tunnel barrier layer, it is possible to obtain a large magnetoresistance (MR) ratio, such that MgO is suitable for a magnetic memory.

As an oxide having the spinel structure, for example, $MgAl_2O_4$, $FeAl_2O_4$, $CoAl_2O_4$, $MgCr_2O_4$, $MgGa_2O_4$, or the like may be used. Particularly, when using $MgAl_2O_4$, it is possible to obtain a large perpendicular magnetic anisotropy, and a large MR ratio, such that $MgAl_2O_4$ is suitable.

Such an oxide may be formed through an rf sputtering method using on oxide target, and may be formed in an oxygen atmosphere using a metal target. In addition, the oxide may be formed by forming a metal film, and then by leaving the metal film as it is in an oxygen atmosphere or a plasma atmosphere containing oxygen for an appropriate time. In addition, a CVD (Chemical Vapor Deposition) method may be used.

Memory Element: Magnetic Layer

The magnetic layer 16 includes as a main component a magnetic material that has a compositional formula of $Fe_xNi_yB_z$, in which, $x+y+z=1$, $2x \leq y \leq 4x$, and $0.1(x+y) \leq z \leq 0.4(x+y)$ are satisfied.

The content of Ni included in the magnetic layer 16 is 0.2 times or more and 4 times or less that of Fe, by atomic %. When including Ni in addition to Fe, a coercive force becomes large, such that the magnetic layer 16 is excellent as a perpendicular magnetization film. In addition, when the content of Ni is excessive, the perpendicular magnetic anisotropy is deteriorated. Therefore, it is preferable the content of Ni be 0.2 times or more and 4 times or less of the content of Fe, by atomic %.

The content of boron included in the magnetic layer 16 is 0.1 times or more and 0.4 times or less of the total content of Fe and Ni, by atomic %. When the content of B in the magnetic layer 16 is set to this range, it is possible to obtain stable perpendicular magnetic anisotropy.

In addition, an element other than Fe, Ni, and boron may be added for improving a characteristic of the magnetic layer 16.

When a boron adsorbing layer 17 is formed on the magnetic layer 16 and then a heat treatment is performed, the boron included in the magnetic layer 16 is diffused to the boron adsorbing layer 17 side. Therefore, the content of boron in the magnetic layer 16 becomes different between the time of forming the magnetic layer 16 and when the memory element is formed and then the heat treatment is performed. A composition ratio of boron in the above-described magnetic layer 16 is defined with respect to boron in the magnetic layer after the heat treatment. Boron atoms included at the time of forming the magnetic layer 16 diffuse mainly into the boron adsorbing layer side by the heat treatment, but when the content of boron atoms included in the magnetic layer and a portion within a distance of 1 nm from an edge of the magnetic layer is set to the above-described range, it is possible to obtain stable perpendicular magnetic anisotropy.

It is preferable that a thickness of the magnetic layer 16 be 0.5 to 2 nm. When the thickness of the magnetic layer 16 is smaller than 0.5 nm, it is difficult to obtain sufficient magnetization as a memory layer of the memory element. In addition, when the thickness is larger than 2 nm, it is difficult to obtain perpendicular magnetization in the magnetic layer 16.

In addition, the magnetic layer 16 may be a single layer formed of the above-described element, or may be classified into a plurality of layers including a layer including Fe and a layer including boron such as an Fe layer and an NiB layer.

In regard to the magnetic layer 16, when a large content of Fe is included in a portion that comes into contact with the oxide layer 15, it is possible to increase the perpendicular magnetic anisotropy or the MR ratio. However, when a large content of Fe is included in a portion apart from the oxide layer 15, the deterioration of the perpendicular magnetic anisotropy becomes large. Therefore, when the film thickness of the magnetic layer 16 is made to be large, it is preferable to divide the magnetic layer 16 into a plurality of layers such as the Fe layer and the NiB layer.

At this time, the layer including Fe is formed at the oxide layer 15 side, and the layer including boron is formed at the boron adsorbing layer 17 side. Even when the magnetic layer 16 is formed by a plurality of layers, it is preferable that the total thickness of the magnetic layer be 0.5 to 2 nm from the above-described reason.

The magnetic layer 16 may be formed through a sputtering method by using a compound target or a mixture target of metal and boron. In addition, the magnetic layer 16 may be formed, for example, through a CVD method. In addition, after a metal layer of Fe and Ni is formed, boron atoms may be introduced into the metal layer through an ion injection method or the like.

Memory Element: Boron Adsorbing Layer

The boron adsorbing layer 17 is a layer including an element that adsorbs boron (boron adsorbing element), and is formed to adjust the content of boron (including the above-described boron) in the magnetic layer 16. The boron adsorbing layer 17 includes at least one selected from a group consisting of Ti, V, Nb, Zr, Ta, Hf, and Y as the boron adsorbing element. When the boron adsorbing layer 17 is disposed on the magnetic layer 16 and an appropriate heat treatment is performed, boron in the magnetic layer 16 and an element in the boron adsorbing layer 17 are chemically coupled, and therefore rearrangement of atoms is promoted. Accordingly, it is possible to obtain large perpendicular magnetic anisotropy by the magnetic layer 16.

The boron adsorbing layer 17 may use the above-described boron adsorbing element alone, or may include the boron adsorbing element and another element. For example, the boron adsorbing layer 17 may be formed of an alloy of one kind or more of the above-described boron adsorbing elements and a magnetic material such as Fe, Co, and Ni.

For example, as a case where the boron adsorbing layer 17 is formed of the alloy of the above-described boron adsorbing elements and the magnetic material such as Fe, Co, and Ni, the magnetic layer 16 and the boron adsorbing layer 17 may be integrally formed. In this case, a first magnetic layer may include a part of magnetic material of the magnetic layer and boron. In addition, a second magnetic layer may include the remaining magnetic material of the magnetic layer and the boron adsorbing material. In addition, the second magnetic layer is formed on the first magnetic material, and a predetermined heat treatment is performed. In this manner, boron included in the first magnetic layer is chemically coupled with the boron adsorbing element included in the second magnetic layer and rearrangement of the atoms is performed. As a result thereof, it is possible to configure a memory element in which the magnetic layer 16 and the boron adsorbing layer 17 are integrally formed by the above-described first and second magnetic layers.

In a case where the magnetic layer 16 and the boron adsorbing layer 17 are formed by the first and second magnetic layers, the total content of Fe, Ni, and B included in the first and second magnetic layers may satisfy the above described composition. That is, the sum of Fe, Ni, and B included in the first magnetic layer, and Fe and Ni included in the second magnetic layer may be expressed by a compositional formula of $Fe_xNi_yB_z$, here, $x+y+z=1$, $2x \leq y \leq 4x$, and $0.1(x+y) \leq z \leq 0.4(x+y)$ are satisfied. In addition, the total thickness of the first magnetic layer and the second magnetic layer is set to 0.5 to 2.0 nm.

As described above, when the magnetic layer 16, which includes the magnetic metal of Fe and Ni, and boron, is formed on the oxide film 15 having a sodium fluoride structure or a spinel structure, it is possible to from a magnetic layer in which a magnetic braking constant becomes small, and has stable perpendicular magnetization. In addition, the boron adsorbing layer 17 including Ti, V, Nb, Zr, Hf, Ta, and Y is laminated on the magnetic layer 16 and a heat treatment is performed thereto, such that it is possible to form a magnetic layer 16 that has a small magnetic braking constant and stable perpendicular magnetization.

Therefore, when the memory layer of the memory element is formed of the above-described magnetic layer, and the above-described oxide layer and boron adsorbing layer are used, it is possible to realize a perpendicular magnetization film allowing spin torque to work efficiently. Therefore, in regard to a magnetic memory using spin torque, it is possible to realize a magnetic memory element that can operate at a high speed with a low current.

In addition, the configuration including the above-described oxide layer, magnetic layer, and boron adsorbing layer may be applied to a magnetic domain wall migration-type memory element including a magnetic layer, an oxide layer, and a boron adsorbing layer, in addition to memory element using spin torque inversion. For example, the above-described boron adsorbing layer is formed on a substrate, and the above-described magnetic layer is formed on the boron adsorbing layer. In addition, an oxide layer is formed on the magnetic layer. Then, this laminated body is processed to have a rectangular strip shape and an electrode is formed on both ends of a memory element, and therefore it is possible to form a magnetic domain wall migration-type memory element.

2. Experiment Example of Memory Element of Present Disclosure

An experiment example of a memory element to which the embodiment is applied will be described. In addition, in the following description, an actual ST-MRAM was not manufactured, but only a sample for measuring a magnetic characteristic was manufactured and the experiment was performed.

Magnetic Layer: Thickness

EXPERIMENT EXAMPLE 1

MgO of 2 nm was formed as an oxide layer on a silicon substrate on which an oxide film was coated, using rf magnetron sputtering. Then, $Fe_{60}Ni_{20}B_{20}$ as a magnetic layer was formed on the oxide layer by dc magnetron sputtering while changing a thickness within a range of 0.4 to 1.8 nm. Then, Zr of 5 nm was formed as the boron adsorbing layer on the magnetic layer using dc magnetron sputtering. After forming the boron adsorbing layer, a heat treatment was performed at 300° C. for one hour and thereby samples of the experiment example 1 were manufactured.

EXPERIMENT EXAMPLE 2

MgO of 2 nm was formed as an oxide layer on a silicon substrate on which an oxide film was coated, using rf magnetron sputtering. Then, $Fe_{20}Ni_{60}B_{20}$ as a magnetic layer was formed on the oxide layer by dc magnetron sputtering while changing a thickness within a range of 0.7 to 2.2 nm. Then, Zr of 5 nm was formed as the boron adsorbing layer on the magnetic layer using dc magnetron sputtering. After forming the boron adsorbing layer, a heat treatment was performed at 300° C. for one hour and thereby samples of the experiment example 2 were manufactured.

Figure 2:
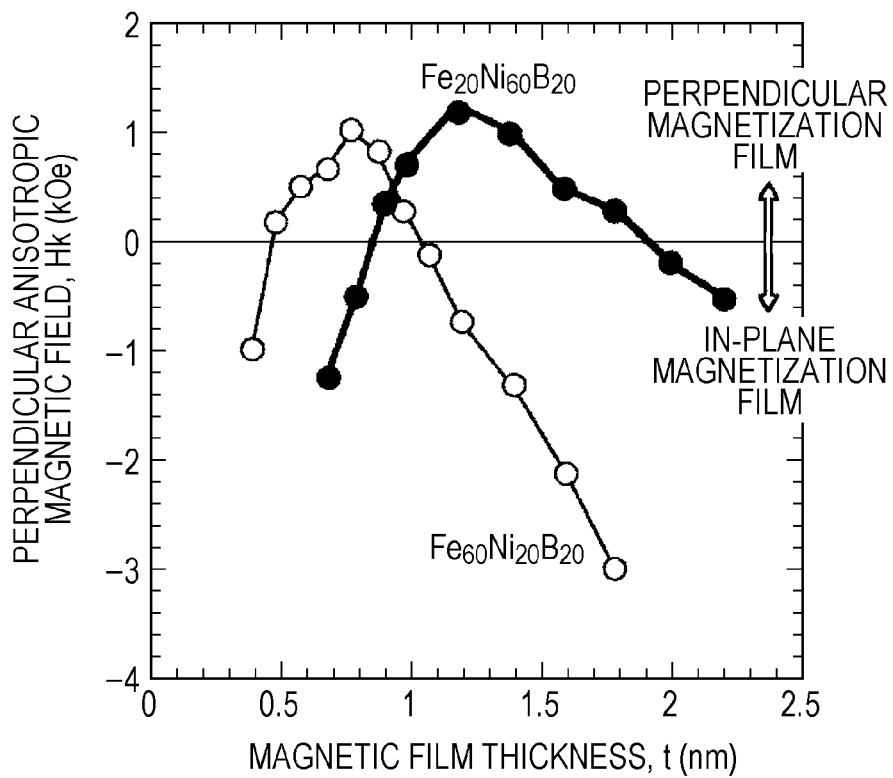
FIG. 2 is a diagram illustrating change in magnetic anisotropy with respect to a thickness of a magnetic layer, in regard to samples of experiment examples 1 and 2.

A change in magnetic anisotropy with respect to a thickness of a magnetic layer of samples of experiment examples 1 and 2 was shown in FIG. 2. The magnetic anisotropy was obtained from saturated magnetic field while applying a magnetic field with an in-plane manner and a perpendicular manner. In FIG. 2, positive magnetic anisotropy was illustrated as perpendicular magnetization and negative magnetic anisotropy was illustrated as in-plane magnetization.

In the samples of the experiment example 1 in which the magnetic layer was formed of $Fe_{60}Ni_{20}B_{20}$, it was possible to obtain perpendicular magnetization with samples having a small thickness and therefore in a thickness of 0.5 to 1.1 nm, a perpendicular magnetization film was obtained. In addition, in the samples of the experiment example 2 in which the magnetic layer was formed of $Fe_{20}Ni_{60}B_{20}$, it was possible to obtain perpendicular magnetization with samples having a thickness larger than $Fe_{60}Ni_{20}B_{20}$ in the experiment example 1 and therefore in a thickness of 0.9 to 1.9 nm, a perpendicular magnetization film was obtained.

In addition, in the experiment examples 1 and 2, the compositions of $Fe_{60}Ni_{20}B_{20}$ and $Fe_{20}Ni_{60}B_{20}$ of the magnetic layer were compositions in a single film before a heat treatment.

From this result, it can be seen that when the thickness of the magnetic layer is set to 0.5 to 2 nm, it is possible to form a memory element having perpendicular magnetization.

Magnetic Layer: Content of Boron

EXPERIMENT EXAMPLE 3

Next, in regard to samples similar to the experiment example 1, a $(Fe_{50}Ni_{50})_{100-x}B_X$ film of 0.8 nm as a magnetic layer was formed using dc magnetron sputtering. At this time, the magnetic layer was formed while changing a composition ratio x. The composition ratio x of boron was changed within a range 0 to 40%. Then, Zr of 5 nm was formed as the boron adsorbing layer on the magnetic layer using dc magnetron sputtering. After forming the boron adsorbing layer, a heat treatment was performed at 300° C. for one hour and thereby samples of the experiment example 3 were manufactured.

Figure 3:
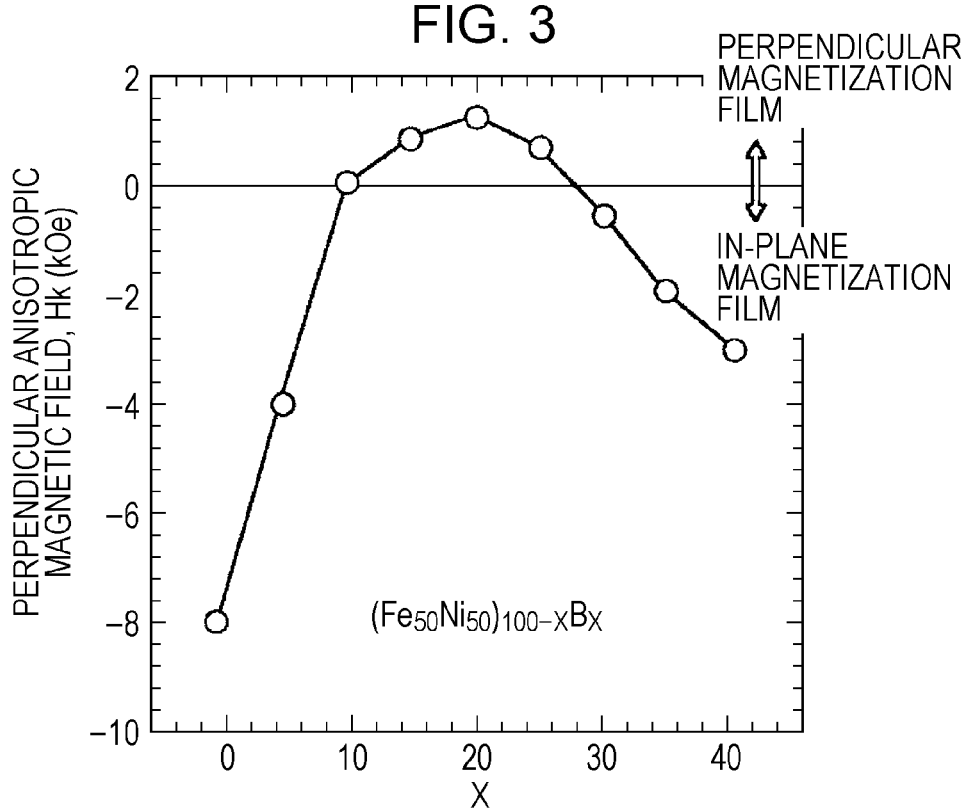
FIG. 3 is a diagram illustrating a relationship between a composition ratio x of boron and a perpendicular anisotropic magnetic field Hk, in regard to samples of an experiment example 3.

In regard to the magnetic layer of the experiment example 3, a change in magnetic anisotropy with respect to the composition ratio x of boron was shown in FIG. 3. The magnetic anisotropy was obtained from saturated magnetization while applying a magnetic field with an in-plane manner and a perpendicular manner. In FIG. 3, in each sample, positive magnetic anisotropy was illustrated as perpendicular magnetization and negative magnetic anisotropy was illustrated as in-plane magnetization.

In the samples of the experiment example 3, when the composition ratio x of boron was 10 to 28, perpendicular magnetization film was realized. Therefore, it was possible to obtain a magnetic layer having perpendicular magnetization in compositions from $(Fe_{50}Ni_{50})_{90}B_{10}$ to $(Fe_{50}Ni_{50})_{72}B_{28}$.

As can be seen from this result, when the content of boron included in the magnetic layer 16 is 0.1 times or more and 0.4 times or less of the total content of Fe and Ni, it is possible to adjust the magnetization of the magnetic layer to have perpendicular direction.

Boron Adsorbing Layer: Perpendicular Magnetization

EXPERIMENT EXAMPLE 4

After substituting a material of the boron adsorbing layer on the magnetic layer, a magnetic characteristic was examined. In regard to samples similar to the experiment example 1, the underlying oxide layer was formed of MgO, and the magnetic layer was formed of $Fe_{60}Ni_{20}B_{20}$ of 0.8 nm, and then each material shown in Table 1 was formed as the boron adsorbing layer having a thickness of 5 nm. Then, a heat treatment was performed at 200 to 400° C. for one hour and thereby samples of the experiment example 4 were manufactured.

A magnetic characteristic was examined on each sample of the experiment example 4 in which the boron adsorbing layer was formed using an element shown in Table 1. The examination result of the magnetic characteristic is shown in Table 1. In Table 1, in regard to the boron adsorbing layer of each sample, materials were classified into materials with which perpendicular magnetization was obtained and materials with which perpendicular magnetization was not obtained before the heat treatment, or at any temperature of 200° C., 300° C., or 400° C.

TABLE 1

| Film in which perpendicular magnetization is obtained | Film in which perpendicular magnetization is not obtained |
|---|---|
| Zr, Hf, Y, Nb, Ti, V, Ta, $Ti_{50}W_{50}$, $Ni_{70}Zr_{30}$ | Mg, Al, Cu, W, Mo, Cr, Pd, Pt, Ru, Ag, Au, Rh, Ir |

As can be seen from Table 1, in samples using a single element of Ti, V, Nb, Zr, Ta, Hf, and Y, and an alloy thereof as the boron adsorbing layer, it was possible to obtain perpendicular magnetization before the heat treatment or after the heat treatment. Contrary to this, in samples using Mg, Al, Cu, W, Mo, Cr, Pd, Pt, Ru, Ag, Au, Rh, and Ir as the boron adsorbing layer, it was difficult to obtain perpendicular magnetization before the heat treatment or after the heat treatment. From this result, when a single element of Ti, V, Nb, Zr, Ta, Hf, and Y, and an alloy thereof is used, the content of boron in the magnetic layer is controlled by the boron adsorbing layer and therefore it is possible to adjust magnetization to have a perpendicular direction.

Oxide Layer: Perpendicular Magnetization

EXPERIMENT EXAMPLE 5

Similarly to the experiment example 4, After substituting a material of the underlying layer (oxide layer) that comes into contact with the magnetic layer, a magnetic characteristic was examined. In regard to samples similar to the experiment example 1, each material shown in Table 2 was formed as the underlying layer having a thickness of 2 nm, and then $Fe_{60}Ni_{20}B_{20}$ of 0.8 nm was formed as the magnetic layer on the underlying layer. After forming Zr of 5 nm on the magnetic layer, a heat treatment was performed at 300° C. for one hour and thereby samples of the experiment example 5 were manufactured.

A magnetic characteristic was examined on each sample of the experiment example 5 in which the underlying layer was formed using an element shown in Table 2. The examination result of the magnetic characteristic is shown in Table 2. In Table 2, in regard to the underlying layer of each sample, materials were classified into materials with which perpendicular magnetization was obtained after the heat treatment and materials with which perpendicular magnetization was not obtained by any heat treatment.

TABLE 2

| Film in which perpendicular magnetization is obtained | Film in which perpendicular magnetization is not obtained |
|---|---|
| MgO, CoO, NiO, TiO, $MgAl_2O_4$, $FeAl_2O_4$ | Ta, Ru, Zr, Au, Pd, Cu, $SiO_2$, $Al_2O_3$ |

As shown in Table 2, in samples using MgO, CoO, NiO, TiO, $MgAl_2O_4$, and $FeAl_2O_4$ as the underlying layer, it was possible to obtain perpendicular magnetization after the heat treatment. Contrary to this, it was difficult to obtain perpendicular magnetization in a metal underlying layer. In addition, in a case where an amorphous-based oxide such as $SiO_2$ and $Al_2O_3$ was used as the underlying layer, it was difficult to obtain perpendicular magnetization. From this result, it is necessary to use an oxide having an NaCl structure or a spinel structure as the underlying layer that comes into contact with the magnetic layer.

Magnetic layer: Fe/Ni Ratio

EXPERIMENT EXAMPLE 6

Similarly to the experiment example 1, $(Fe_{100-x}Ni_x)_{80}C_{20}$ of 0.8 nm was formed as the magnetic layer on an MgO layer of 2 nm while changing x. Here, x was changed within a range of 0 to 100. After forming Zr of 5 nm as the boron adsorbing layer on the magnetic layer, a heat treatment was performed at 300° C. for one hour and thereby samples of the experiment example 6 were manufactured.

Figure 4:
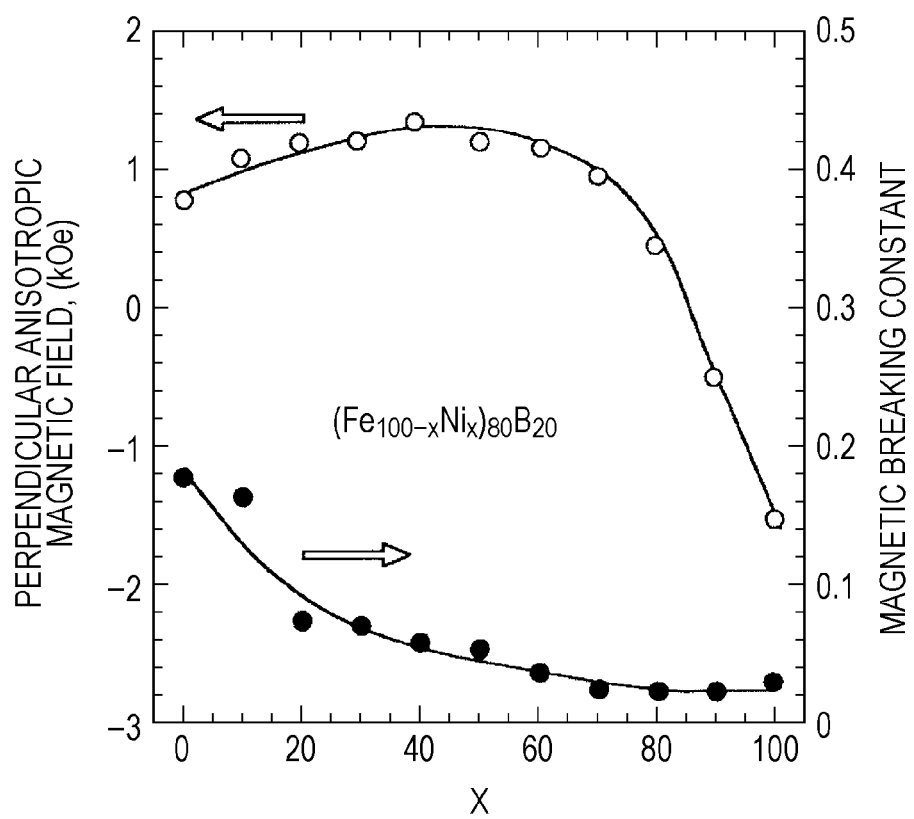
FIG. 4 is a diagram illustrating a relationship between a composition ratio x of Ni, a perpendicular anisotropic magnetic field, and a magnetic braking constant, in regard to samples of an experiment example 6.

In FIG. 4, in regard to the samples of the experiment example 6, a relationship between the composition ratio x of Ni with respect to Fe in the magnetic layer and perpendicular anisotropic magnetic field is shown as a white spot. In addition, a relationship between the composition ratio x of Ni with respect to Fe and a magnetic braking constant, which was obtained from a ferromagnetic resonance, is shown as a black spot.

As shown in FIG. 4, in the samples of the experiment example 6, when the composition ratio x of Ni with respect to Fe is substantially 60%, as the composition ratio x increases, the perpendicular anisotropic magnetic field increases slowly. In addition, when the composition ratio x exceeds 80%, the perpendicular anisotropic magnetic field decreases sharply.

Contrary to this, the magnetic braking constant decreases as the composition ratio x of Ni with respect to Fe increases. Particularly, until the composition ratio x reaches substantially 15%, the magnetic braking constant decreases sharply. In addition, when the composition ratio x becomes 15% or more, the magnetic braking constant decreases slowly, and therefore a stably small value is shown.

From this result, when the composition ratio x of Ni with respect to Fe is set to 15 to 80%, it is possible to form a memory element in which the magnetic anisotropy becomes large and the magnetic braking constant is small. Therefore, the content of Ni is preferably 0.2 to 4 times of Fe to realize the magnetic layer having a small magnetic braking constant.

Magnetic Layer: Boron Adsorbing Layer

A case where the boron adsorbing layer is formed of an alloy of a boron adsorbing element and a magnetic material will be described.

EXPERIMENT EXAMPLE 7

Similarly to the experiment example 1, MgO of 2 nm was formed as an oxide layer. Each material shown in Table 3 as a first magnetic layer is formed with each thickness, and then each material shown in Table 3 as a second magnetic layer is formed with each thickness on the first magnetic layer. Then, Ru of 5 nm as a cap layer was formed on the second magnetic layer, and a heat treatment was performed at 300° C. for one hour and thereby samples of the experiment example 7 were manufactured.

In regard to each sample of the experiment example 7, a relationship between a combination of the first and second magnetic layers, and the anisotropic magnetic field is shown in Table 3. When the anisotropic magnetic field is positive, this means there is a perpendicular magnetization film, and when the anisotropic magnetic field is negative, this means there is an in-plane magnetization film.

TABLE 3

| First magnetic layer | Second magnetic layer | Anisotropy magnetic field |
|---|---|---|
| $Fe_{80}B_{20}$ 0.5 nm | $Ni_{80}Zr_{20}$ 0.5 nm | 1.2 kOe |
| $Fe_{35}Ni_{35}B_{30}$ 0.5 nm | $Fe_{80}Ta_{20}$ 0.5 nm | 0.9 kOe |
| $Fe_{70}B_{30}$ 0.3 nm | $Ni_{70}Fe_{15}Hf$ 0.6 nm | 1.4 kOe |
| $Fe_{40}Ni_{40}B_{20}$ 0.5 nm | $Co_{85}Zr_{15}$ 0.5 nm | 1.0 kOe |
| $Ni_{80}Zr_{20}$ 0.5 nm | $Fe_{80}B_{20}$ 0.5 nm | −6.5 kOe |
| Fe 0.3 nm | $Ni_{70}Fe_{20}Zr_{10}$ 0.5 nm | −8.3 kOe |
| $Fe_{80}B_{20}$ 0.5 nm | Ni 0.5 nm | −5.5 kOe |

In a case where the first magnetic layer was a magnetic layer including boron and the second magnetic layer was a magnetic layer including a boron adsorbing element of Zr, Ta, and Hf, it was possible to obtain perpendicular magnetization. However, In a case where the first magnetic layer did not include boron and the second magnetic layer did not include a boron adsorbing element of Zr, Ta, and Hf, it was difficult to obtain perpendicular magnetization and led to in-plane magnetization.

From this result, in a case where a layer is formed of an alloy of a boron adsorbing element and a magnetic material, it is necessary that the first magnetic layer includes boron, and the second magnetic layer include the boron adsorbing element. In addition, as a total composition of the first and second magnetic layers, it is necessary for Fe, Ni, and B to satisfy a relationship of $Fe_xNi_yB_z$ (here, $x+y+z=1$, $0.2x \leq y \leq 4x$, and $0.1(x+y) \leq z \leq 0.4(x+y)$).

When this condition is satisfied, it is possible to configure a memory element having perpendicular magnetization.

In a case where the first magnetic layer is formed of $Fe_{80}B_{20}$ and the second magnetic layer is formed of $Ni_{80}Zr_{20}$, Fe and B, and Ni are formed as different layers, and Ni and the boron adsorbing element are formed as the same layers. In this case, when a total composition of the first and second magnetic layers satisfies a predetermined relationship, it is also possible to form a memory element having perpendicular magnetization.

Similarly, in a case where the first magnetic layer is formed of $Fe_{70}B_{30}$ and the second magnetic layer is formed of $Ni_{70}Fe_{15}Hf_{15}$, when a total composition of the first and second magnetic layers satisfies a predetermined relationship, it is also possible to form a memory element having perpendicular magnetization.

In addition, in a case where the first magnetic layer is formed of $Fe_{35}Ni_{35}B_{30}$ and the second magnetic layer is formed of $Fe_{80}Hf_{20}$, Fe in the magnetic layer is divided into the first and second magnetic layers, and different layers are formed. In this case, a total composition of the first and second magnetic layers also satisfies a relationship of $Fe_x Ni_y B_z$ (here, $x+y+z=1$, $0.2x \leq y \leq 4x$, and $0.1(x+y) \leq z \leq 0.4(x+y)$). Furthermore, the first magnetic layer is a magnetic layer including boron and the second magnetic layer is a magnetic layer including the boron adsorbing element. Thus, it is possible to configure a memory element having perpendicular magnetization.

In addition, in a case where the first magnetic layer is formed of $Fe_{40}Ni_{40}B_{20}$ and the second magnetic layer is formed of $CO_{80}Zr_{20}$, Co is contained in the second magnetic layer together with the boron adsorbing element.

Other elements such as Co may be included other than Fe, Ni, and B making up the magnetic layer, and the boron adsorbing element included in the boron adsorbing layer. In this case, when the total composition of the first and second magnetic layers satisfies a predetermined relationship, it is also possible to form a memory element having perpendicular magnetization.

In addition, in a case where $Ni_{80}Zr_{20}$ including the boron adsorbing element is used as the first magnetic layer and $Fe_{80}B_{20}$ including boron is used as the second magnetic layer, it is possible to configure a memory element having perpendicular magnetization. That is, to configure the memory element having perpendicular magnetization, it is necessary to form a magnetic layer including boron at the oxide side and to form a layer including the boron adsorbing element at side opposite to the oxide layer.

In addition, in a case where the first magnetic layer was configured by only Fe with boron not included, or the second magnetic layer was configured by only Ni with the boron adsorbing element not included in the second magnetic layer, it was difficult to configure the memory element having perpendicular magnetization.

As described above, a configuration may be set where a first magnetic layer including a part of magnetic material of a magnetic layer and boron is formed as a magnetic layer, and a second magnetic layer including the remaining magnetic material and the boron adsorbing material is formed. In this case, boron in the first magnetic layer (magnetic layer) is diffused into the second magnetic layer (boron adsorbing layer) through a heat treatment. In addition, boron and the boron adsorbing element are chemically coupled with each other, and rearrangement of atoms is performed at the first magnetic layer (magnetic layer) and the second magnetic layer (boron adsorbing layer). At this time, the magnetic layer and the boron adsorbing layer may be integrally formed.

In addition, from the result shown in Table 3, in a case where the magnetic layer and the boron adsorbing layer are configured by a configuration where the first and second magnetic layers are integrally formed, it is necessary to form a magnetic layer including boron at the oxide side and to form a layer including the boron adsorbing element at side opposite to the oxide layer.

Memory Element

Next, a magnetization inversion magnetic memory element of the spin injection type was actually manufactured by using the magnetic layer according to the above-described magnetic layer, and a characteristic thereof was examined.

EXPERIMENT EXAMPLE 8

Ta of 5 nm and Ru of 5 nm as an underlying layer are formed on a substrate using a method similar to the experiment example 1. Then, a magnetization-fixed layer in which CoPt of 2 nm, Ru of 0.45 nm, and CoFeB of 1 nm were perri-combined was formed as the magnetization-fixed layer on the underlying layer. Next, MgO of 0.8 nm was formed as the oxide layer on the magnetization-fixed layer. As the recording layer on the oxide layer, a magnetic layer including Fe of 0.15 nm and $Fe_{40}Ni_{40}B_{20}$ of 1 nm was laminated on the oxide layer, and Ta of 5 nm was formed as the boron adsorbing layer on the recording layer. Then, a heat treatment was performed at 300° C. for one hour and thereby samples of the experiment example 8 were manufactured. The memory element had a circular shape with a diameter of 150 nm.

EXPERIMENT EXAMPLE 9

Comparative Example

Ta of 5 nm and Ru of 5 nm as an underlying layer are formed on a substrate using a method similar to the experiment example 1. Then, a magnetization-fixed layer in which CoPt of 2 nm, Ru of 0.45 nm, and CoFeB of 1 nm were perri-combined was formed as the magnetization-fixed layer on the underlying layer. Next, MgO of 0.8 nm was formed as the oxide layer on the magnetization-fixed layer. As the recording layer on the oxide layer, a laminated film of Co of 0.2 nm and Pd of 0.8 nm was formed with three cycles, and Ta of 5 nm as a cap layer was formed on the recording layer. Then, a heat treatment was performed at 300° C. for one hour and thereby samples of the experiment example 9 (comparative example) were manufactured. The memory element had a circular shape with a diameter of 150 nm.

In Table 4, an inversion current, resistance $KV/k_B T$ against thermal fluctuation, and an MR ratio of the samples of the experiment examples 8 and 9 are shown.

TABLE 4

|  | Example | Comparative example |
|---|---|---|
| Configuration of memory layer | $Fe_{40}Ni_{40}B_{20}$: 1 nm | [Co: 0.2 nm/Pd: 0.8 nm] × 3 |
| Inversion current | 175 µA | 630 µA |
| $KV/k_B T$ | 42 | 41 |
| MR ratio | 88% | 12% |

As shown in Table 4, the inversion current was 175 µA in the experiment example 8, and contrary to this, 630 µA in the experiment example 9. In this way, in the sample having a configuration in which Fe of 0.15 nm and $Fe_{40}Ni_{40}B_{20}$ of 1 nm were laminated as the magnetic layer, the inversion current was low, such that it was possible to configure a memory element suitable for low write current.

In addition, in regard to the resistance against thermal fluctuation and the MR ratio, those in the experiment example 8 are larger than those in the experiment example 9.

As described above, in the spin injection magnetization inversion magnetic memory of the experiment example 8 using the magnetic layer including the Fe, and $Fe_{40}Ni_{40}B_{20}$, the magnetic braking constant was small and magnetization inversion may be realized with a low current, such that this memory may be effective as a low power consumption magnetic memory.

As described above, according to the embodiment, it is possible to configure a memory element in which the oxide layer is set as a tunnel barrier layer, and magnetization inversion is performed through spin injection torque which works between magnetic layers disposed at both sides of the tunnel barrier layer. As the memory layer of the memory element, a magnetic material that has a compositional formula of $Fe_xNi_yB_z$, in which $x+y+z=1$, $0.2x \leq y \leq 4x$, and $0.1(x+y) \leq z \leq 0.4(x+y)$ are satisfied. Due to this configuration, when this magnetic material is used for the recording layer accompanied with magnetization inversion, it is possible to realize a magnetic memory in which a decrease in a current necessary for inversion and the low power consumption are realized. In addition, when a layer formed of a boron adsorbing layer including at least one selected from a group consisting of Ti, V, Nb, Zr, Ta, Hf, and Y is formed on the magnetic layer including boron, it is possible to further decrease the current necessary for magnetization inversion. In addition, when the configuration of the memory element according to the present disclosure is used for the magnetic domain wall migration-type memory element, it is possible to realize the decrease in a driving current of the magnetic domain wall.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention claimed is:

1. A memory element, comprising:
   a magnetic layer that includes $Fe_xNi_yB_z$ as a main component, where $x+y+z=1$, $0.2x \leq y \leq 4x$, and $0.1(x+y) \leq z \leq 0.4(x+y)$, and has magnetic anisotropy in a direction perpendicular to a film face; and
   an oxide layer that is formed of an oxide having a sodium chloride structure or a spinel structure and comes into contact with a first face of the magnetic layer, wherein a layer including an element that adsorbs boron is formed on a second face of the magnetic layer, and wherein the second face is opposite the first face.

2. The memory element according to claim 1, wherein the layer including an element that adsorbs boron is configured to be in contact with an interconnect that supplies a current to the memory element.

3. The memory element according to claim 2,
   wherein the layer including the element that adsorbs boron includes at least one kind selected from a group consisting of Ti, V, Nb, Zr, Ta, Hf, and Y, as the element that adsorbs boron.

4. The memory element according to claim 3,
   wherein the layer including the element that adsorbs boron is formed of an alloy that includes at least one kind of element selected from a group consisting of Ti, V, Nb, Zr, Ta, Hf, and Y, and at least one kind of element selected from a group consisting of Fe, Co, and Ni.

5. The memory element according to claim 1,
   wherein the magnetic layer, and a layer serving as a reference for information recorded in the magnetic layer are laminated with the oxide layer interposed therebetween.

6. The memory element according to claim 1,
   wherein a thickness of the magnetic layer is from 0.5 to 2nm.

7. The memory element according to claim 1,
   wherein the oxide layer is formed of MgO or $MgAl_2O_4$.

8. A memory, comprising:
   a memory element including a magnetic layer that includes $Fe_xNi_yB_z$ as a main component, where $x+y+z=1$, $0.2x \leq y \leq 4x$, and $0.1(x+y) \leq z \leq 0.4(x+y)$ and has magnetic anisotropy in a direction perpendicular to a film face, and an oxide layer that is formed of an oxide having a sodium chloride structure or a spinel structure and comes into contact with a first face of the magnetic layer, wherein a layer including an element that adsorbs boron is formed on a second face of the magnetic layer, the second face being opposite the first face; and
   an interconnect that supplies a current to the memory element.

* * * * *